United States Patent
Nishizawa et al.

(10) Patent No.: US 10,814,402 B2
(45) Date of Patent: Oct. 27, 2020

(54) COATED CUTTING TOOL

(71) Applicant: TUNGALOY CORPORATION, Fukushima (JP)

(72) Inventors: Hirosato Nishizawa, Iwaki (JP); Kenji Metoki, Iwaki (JP)

(73) Assignee: TUNGALOY CORPORATION, Fukushima (JP)

(*) Notice: Subject to any disclaimer, the term of this patent is extended or adjusted under 35 U.S.C. 154(b) by 175 days.

(21) Appl. No.: 16/110,546

(22) Filed: Aug. 23, 2018

(65) Prior Publication Data
US 2019/0061014 A1    Feb. 28, 2019

(30) Foreign Application Priority Data
Aug. 24, 2017    (JP) ................. 2017-160981

(51) Int. Cl.
*B23B 27/14*    (2006.01)
*B28B 11/04*    (2006.01)
(Continued)

(52) U.S. Cl.
CPC ............ *B23B 27/148* (2013.01); *B28B 11/04* (2013.01); *B28B 11/243* (2013.01);
(Continued)

(58) Field of Classification Search
USPC .......... 51/307, 309; 428/325, 216, 697, 698, 428/699
See application file for complete search history.

(56) References Cited

U.S. PATENT DOCUMENTS

2008/0057280 A1    3/2008    Watanabe et al.
2009/0130434 A1*   5/2009    Zhu .................. C04B 35/58014
                                               428/328
(Continued)

FOREIGN PATENT DOCUMENTS

EP    3269478 A1    1/2018
JP    H5-269606 A   10/1993
(Continued)

*Primary Examiner* — Archene A Turner
(74) *Attorney, Agent, or Firm* — Studebaker & Brackett PC

(57) ABSTRACT

A coated cutting tool, comprising: a substrate made of a cubic boron nitride-containing sintered body; and a coating layer formed on the substrate, wherein the cubic boron nitride-containing sintered body includes 65 volume % or more and 85 volume % or less of cubic boron nitride, and 15 volume % or more and 35 volume % or less of a binder phase; the cubic boron nitride is in a form of particles, the particles having an average particle size from 1.5 μm or more to 4.0 μm or less; the coating layer includes a lower layer, and an upper layer formed on the lower layer; the lower layer contains particles each having a composition represented by $(Ti_{1-x}Al_x)N$; the lower layer has an average thickness from 0.1 μm or more to 1.0 μm or less; the particles forming the lower layer have an average particle size from 0.01 μm or more to 0.05 μm or less; the upper layer contains particles each having a composition represented by $(Ti_{1-y}Al_y)(C_{1-z}N_z)$; and the upper layer has an average thickness from 1.0 μm or more to 5.0 μm or less.

20 Claims, 1 Drawing Sheet

(51) Int. Cl.
  *B28B 11/24* (2006.01)
  *C23C 14/32* (2006.01)
  *C23C 14/06* (2006.01)
  *C04B 35/5831* (2006.01)
  *C23C 14/02* (2006.01)
  *C23C 30/00* (2006.01)
  *C04B 35/645* (2006.01)
  *C04B 41/00* (2006.01)
  *C04B 41/52* (2006.01)
  *C04B 41/89* (2006.01)

(52) U.S. Cl.
  CPC ........ *C04B 35/5831* (2013.01); *C04B 35/645* (2013.01); *C04B 41/00* (2013.01); *C04B 41/009* (2013.01); *C04B 41/52* (2013.01); *C04B 41/89* (2013.01); *C23C 14/022* (2013.01); *C23C 14/0641* (2013.01); *C23C 14/0647* (2013.01); *C23C 14/0664* (2013.01); *C23C 14/325* (2013.01); *C23C 30/005* (2013.01); *B23B 2226/125* (2013.01); *B23B 2228/105* (2013.01); *C04B 2235/3217* (2013.01); *C04B 2235/3813* (2013.01); *C04B 2235/3843* (2013.01); *C04B 2235/3847* (2013.01); *C04B 2235/3856* (2013.01); *C04B 2235/3873* (2013.01); *C04B 2235/3886* (2013.01); *C04B 2235/402* (2013.01); *C04B 2235/404* (2013.01); *C04B 2235/405* (2013.01); *C04B 2235/786* (2013.01); *C04B 2235/80* (2013.01); *C04B 2235/96* (2013.01)

(56) References Cited

U.S. PATENT DOCUMENTS

2015/0158094 A1* 6/2015 Igarashi .................. C23C 16/36
  428/216
2016/0068449 A1   3/2016 Tsukihara et al.
2017/0362130 A1  12/2017 Hirano et al.
2018/0135168 A1   5/2018 Paseuth et al.

FOREIGN PATENT DOCUMENTS

| | | | |
|---|---|---|---|
| JP | 05-345976 | * | 12/1993 |
| JP | H09-117806 A | | 5/1997 |
| JP | 2008-87150 A | | 4/2008 |
| JP | 2009-090417 | * | 4/2009 |
| JP | 2009-90417 A | | 4/2009 |
| JP | 2009-208155 A | | 9/2009 |
| JP | 2009-255282 A | | 11/2009 |
| JP | 2011-224715 | * | 11/2011 |
| JP | 2014-166672 | * | 9/2014 |
| JP | 2015-123530 A | | 7/2015 |
| JP | 2016-155221 A | | 9/2016 |
| WO | 2016/104563 A1 | | 6/2016 |

* cited by examiner

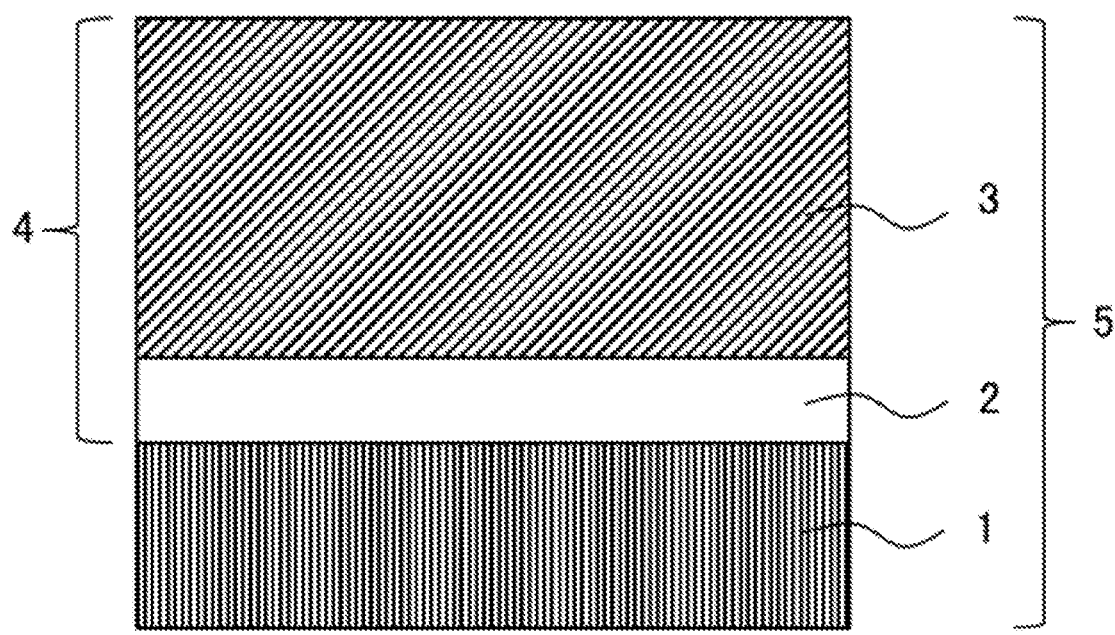

COATED CUTTING TOOL

TECHNICAL FIELD

The present invention relates to a coated cutting tool.

BACKGROUND ART

A cubic boron nitride sintered body has hitherto been used as a cutting tool for machining hardened steel, heat-resistant alloys, or the like because the cubic boron nitride sintered body has high hardness and excellent thermal conductivity. In recent years, a coated cubic boron nitride sintered body tool, which includes a substrate made of a cubic boron nitride sintered body and a coating layer coated on the surface of the substrate, has been used as a cutting tool for the purpose of improving machining efficiency.

In view of the foregoing, various technologies for improving such characteristics of the coating layer have been proposed. For example, Patent Document 1 proposes a coated cutting tool made of a cubic boron nitride-based sintered material. In the coated cutting tool, on the surface of a substrate made of a cubic boron nitride-based sintered material, a coating layer is formed by vapor deposition. The coating layer includes a lower part layer including a composite nitride layer of titanium and aluminum, a first intermediate layer including a nitride layer of titanium, a second intermediate layer including a carbonitride layer of titanium, and an upper part layer including a nitride layer of titanium.

CITATION LIST

Patent Documents

Patent Document 1: JP2009-255282 A

SUMMARY

Technical Problem

In cutting in recent years, a cutting speed, a feeding speed, and a cut-in depth have been remarkably increased, and hence it is demanded to improve the fracture resistance of conventional tools. Especially, there is an increase in opportunity of cutting of hardened steel, heat-resistant alloys, or the like, which places loads on coated cutting tools. Under such severe cutting conditions, in a conventional coated cutting tool in which adhesion of a coating layer to a substrate is insufficient, peeling occurs to cause fracturing. Consequently, a long tool life cannot be achieved, which is a problem.

Against this background, the cutting tool described in Patent Document 1 above has a problem that the particle size of the lower part layer is large, and adhesion is thus insufficient, which may lead to peeling. Further, the cutting tool described in Patent Document 1 also has a problem that fracture resistance is accordingly insufficient, and the tool life is short.

The present invention has been made in order to solve the above problems, and an object of the present invention is to provide a coated cutting tool having improved fracture resistance and a long tool life.

Solution to Problem

The present inventors have conducted studies regarding extension of the tool life of a coated cutting tool, and have accordingly found that the following configurations of a coated cutting tool allow the fracture resistance of the coated cutting tool to be improved with the improvement of adhesion between a substrate and a coating layer, and found that, as a result, the tool life of the coated cutting tool can be extended. The present inventors have completed the present invention based on such findings.

Specifically, the gist of the present invention is as set forth below.

[1]

A coated cutting tool, comprising:

a substrate made of a cubic boron nitride-containing sintered body; and a coating layer formed on the substrate, wherein:

the cubic boron nitride-containing sintered body includes 65 volume % or more and 85 volume % or less of cubic boron nitride, and 15 volume % or more and 35 volume % or less of a binder phase;

the cubic boron nitride is in a form of particles, the particles having an average particle size from 1.5 μm or more to 4.0 μm or less;

the coating layer includes a lower layer, and an upper layer formed on the lower layer;

the lower layer contains particles each having a composition represented by formula (1) below:

$$(Ti_{1-x}Al_x)N \qquad (1)$$

[in formula (1), x denotes an atomic ratio of an Al element to a total of a Ti element and the Al element and satisfies $0.55 \leq x \leq 0.80$];

the lower layer has an average thickness from 0.1 μm or more to 1.0 μm or less;

the particles forming the lower layer have an average particle size from 0.01 μm or more to 0.05 μm or less;

the upper layer contains particles each having a composition represented by formula (2) below:

$$(Ti_{1-y}Al_y)(C_{1-z}N_z) \qquad (2)$$

[in formula (2), y denotes the atomic ratio of the Al element to a total of the Ti element and the Al element and satisfies $0 \leq y \leq 0.80$, and z denotes an atomic ratio of an N element to a total of a C element and the N element and satisfies $0.65 \leq z < 1.00$]; and the upper layer has an average thickness from 1.0 μm or more to 5.0 μm or less.

[2]

The coated cutting tool according to [1], wherein the particles forming the upper layer have an average particle size from 0.1 μm or more to 1.5 μm or less.

[3]

The coated cutting tool according to [1] or [2], wherein the upper layer contains particles each having a composition represented by formula (3) below:

$$Ti(C_{1-z}N_z) \qquad (3)$$

[in formula (3), z denotes the atomic ratio of the N element to a total of the C element and the N element and satisfies $0.65 \leq z \leq 0.90$].

[4]

The coated cutting tool according to any one of [1] to [3], wherein:

a compound forming the upper layer is a cubic crystal; and in X-ray diffraction analysis, a ratio I (111)/I (200) between a peak intensity I (111) of a plane (111) of the upper layer, and a peak intensity I (200) of a plane (200) of the upper layer is more than 1 and 15 or less.

[5]

The coated cutting tool according to any one of [1] to [4], wherein the coating layer has an average thickness from 1.5 μm or more to 6.0 μm or less.

[6]

The coated cutting tool according to any one of [1] to [5], wherein the upper layer has a residual stress value from −3.0 GPa or higher to −0.1 GPa or lower.

[7]

The coated cutting tool according to any one of [1] to [6], wherein the binder phase includes a compound formed of at least one metal element selected from the group consisting of Ti, Zr, Hf, V, Nb, Ta, Cr, Mo, W, Al, and Co, and at least one element selected from the group consisting of C, N, O, and B.

Advantageous Effects of Invention

The coated cutting tool of the present invention has excellent fracture resistance and thus provides an effect to achieve a longer tool life than the conventional coated cutting tools.

BRIEF DESCRIPTION OF DRAWINGS

The FIGURE is a schematic view showing an example of a coated cutting tool of the present invention.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

A coated cutting tool of the present embodiment includes: a substrate made of a cubic boron nitride-containing sintered body; and a coating layer formed on the substrate. The cubic boron nitride-containing sintered body includes 65 volume % or more and 85 volume % or less of cubic boron nitride, and 15 volume % or more and 35 volume % or less of a binder phase. The cubic boron nitride is in a form of particles, and the particles have an average particle size from 1.5 μm or more to 4.0 μm or less. The coating layer includes a lower layer, and an upper layer formed on the lower layer. The lower layer contains particles each having a composition represented by formula (1) below:

$(Ti_{1-x}Al_x)N$     (1)

[in formula (1), x denotes an atomic ratio of an Al element to a total of a Ti element and the Al element and satisfies 0.55≤x≤0.80].

The lower layer has an average thickness from 0.1 μm or more to 1.0 μm or less. The particles forming the lower layer have an average particle size from 0.01 μm or more to 0.05 μm or less. The upper layer contains particles each having a composition represented by formula (2) below:

$(Ti_{1-y}Al_y)(C_{1-z}N_z)$     (2)

[in formula (2), y denotes the atomic ratio of the Al element to a total of the Ti element and the Al element and satisfies 0≤y≤0.80, and z denotes an atomic ratio of an N element to a total of a C element and the N element and satisfies 0.65≤z<1.00].

The upper layer has an average thickness from 1.0 μm or more to 5.0 μm or less.

The coated cutting tool of the present embodiment includes the substrate made of the cubic boron nitride-containing sintered body, and hence has excellent wear resistance and fracture resistance against machining of hardened steel or heat-resistant alloys, for example. Further, the coated cutting tool of the present embodiment has improved fracture resistance because the cubic boron nitride-containing sintered body includes 65 volume % or more of cubic boron nitride and 35 volume % or less of the binder phase, and has improved wear resistance because the cubic boron nitride-containing sintered body includes 85 volume % or less of cubic boron nitride and 15 volume % or more of the binder phase. Moreover, the coated cutting tool of the present embodiment has improved thermal conductivity because the average particle size of the particles of cubic boron nitride is 1.5 μm or more, and hence reaction wear can be prevented. Thus, a reduction in strength of a cutting edge can be prevented, and the coated cutting tool of the present embodiment therefore has improved fracture resistance. Meanwhile, in the coated cutting tool of the present embodiment, when the average particle size of the particles of cubic boron nitride is 4.0 μm or less, the binder phase has a uniform thickness, and the strength of the cubic boron nitride-containing sintered body is thus improved. In addition, in the coated cutting tool of the present embodiment, the coating layer includes the lower layer containing the particles each having the composition represented by formula (1) above, and hence has excellent adhesion, and the coating layer can be prevented from being peeled off. Thus, the coated cutting tool of the present embodiment has improved fracture resistance. Further, when the atomic ratio x of the Al element in formula (1) above is 0.55 or more, the adhesion between the coating layer and the substrate is more effectively improved. As a result, the fracture resistance of the coated cutting tool of the present embodiment is improved. Further, in the coating layer, when the atomic ratio x of the Al element in formula (1) above is 0.80 or less, formation of a nitride of Al, which is a hexagonal crystal, can be prevented, and hence a reduction in strength of the lower layer can be prevented. In addition, when the average thickness of the lower layer is 0.1 μm or more, the lower layer can uniformly cover the surface of the substrate, and hence the adhesion between the substrate and the coating layer is improved. Thus, the fracture resistance of the coated cutting tool of the present embodiment is improved. Meanwhile, when the average thickness of the lower layer is 1.0 μm or less, a reduction in strength of the lower layer can be prevented, and hence the fracture resistance of the coated cutting tool of the present embodiment is improved. In addition, in the coated cutting tool of the present embodiment, when the average particle size of the particles forming the lower layer is 0.01 μm or more, a reduction in strength of the lower layer can be prevented and the fracture resistance is thus improved, and when the average particle size of the particles forming the lower layer is 0.05 μm or less, the adhesion between the substrate and the coating layer is improved and the fracture resistance is thus improved. Further, the coated cutting tool has improved wear resistance because the coated cutting tool includes, on the lower layer, the upper layer containing the particles each having the composition represented by formula (2) above. Moreover, when the atomic ratio y of the Al element in formula (2) above is 0.80 or less, formation of a nitride of Al, which is a hexagonal crystal, can be prevented, and hence the wear resistance of the upper layer is improved. In addition, in the coated cutting tool of the present embodiment, when the atomic ratio z of the N element in formula (2) above is 0.65 or more, the toughness of the upper layer is improved and the fracture resistance is thus improved, and when the atomic ratio z of the N element in formula (2) above is less than 1.00, the hardness of the upper layer increases and the wear resistance is thus improved. Further, in the coated cutting tool of the present embodiment, when the average thickness of the upper layer is 1.0 μm or more, the wear resistance is improved, and when the average thickness of the upper layer is 5.0 μm or less, a reduction in adhesion can be prevented, with the result that a reduction in fracture resistance can be prevented.

The coated cutting tool of the present embodiment includes the substrate made of the cubic boron nitride-containing sintered body, and the coating layer formed on the surface of the substrate. The coated cutting tool of the present embodiment includes the substrate made of the cubic boron nitride-containing sintered body, and hence has excellent wear resistance and fracture resistance against machining of hardened steel or heat-resistant alloys, for example.

In the coated cutting tool of the present embodiment, the cubic boron nitride-containing sintered body includes 65 volume % or more and 85 volume % or less of cubic boron nitride, and 15 volume % or more and 35 volume % or less of the binder phase. The coated cutting tool of the present embodiment has improved fracture resistance because the cubic boron nitride-containing sintered body includes 65 volume % or more of cubic boron nitride and 35 volume % or less of the binder phase. Meanwhile, the coated cutting tool of the present embodiment has improved wear resistance because the cubic boron nitride-containing sintered body includes 85 volume % or less of cubic boron nitride and 15 volume % or more of the binder phase.

In the coated cutting tool of the present embodiment, cubic boron nitride is in the form of particles, and the average particle size of the particles is from 1.5 μm or more to 4.0 μm or less. The coated cutting tool of the present embodiment has improved thermal conductivity because the average particle size of the particles of cubic boron nitride is 1.5 μm or more, and hence reaction wear can be prevented. Thus, a reduction in strength of the cutting edge can be prevented, and the coated cutting tool of the present embodiment therefore has improved fracture resistance. Meanwhile, in the coated cutting tool of the present embodiment, when the average particle size of the particles of cubic boron nitride is 4.0 μm or less, the binder phase has a uniform thickness, and hence the strength of the cubic boron nitride-containing sintered body is improved.

In the present embodiment, the average particle size of the particles of cubic boron nitride is measured by a method described in Examples below.

In the coated cutting tool of the present embodiment, the binder phase preferably contains at least one metal element selected from the group consisting of Ti (titanium), Zr (zirconium), Hf (hafnium), V (vanadium), Nb (niobium), Ta (tantalum), Cr (chromium), Mo (molybdenum), W (tungsten), Al (aluminum), and Co (cobalt). Alternatively, the binder phase preferably includes a compound formed of at least one metal element selected from the group consisting of Ti, Zr, Hf, V, Nb, Ta, Cr, Mo, W, Al, and Co, and at least one element selected from the group consisting of C (carbon), N (nitrogen), O (oxygen), and B (boron). The coated cutting tool of the present embodiment tends to have an excellent balance between the wear resistance and the fracture resistance when the binder phase includes such a compound.

In the coated cutting tool of the present embodiment, when the average thickness of the entire coating layer is 1.5 μm or more, the wear resistance tends to be more improved. Meanwhile, when the average thickness of the entire coating layer is 6.0 μm or less, the fracture resistance tends to be more improved. Thus, in the coated cutting tool of the present embodiment, the average thickness of the entire coating layer is preferably from 1.5 μm to 6.0 μm. In particular, from the same perspective as that set forth above, in the coated cutting tool of the present embodiment, the average thickness of the entire coating layer is preferably from 2.0 μm or more to 4.9 μm or less.

In the coated cutting tool of the present embodiment, the coating layer includes the lower layer, and the upper layer formed on the lower layer.

The lower layer contains the particles each having the composition represented by formula (1) below.

$$(Ti_{1-x}Al_x)N \quad (1)$$

In the coated cutting tool of the present embodiment, when the coating layer includes the lower layer containing the particles each having the composition represented by formula (1) above, the adhesion is excellent, and the coating layer can be prevented from being peeled off. Thus, the fracture resistance of the coated cutting tool of the present embodiment is improved. In the coated cutting tool of the present embodiment, the lower layer is therefore preferably formed on the surface of the substrate. In formula (1) above, x denotes the atomic ratio of the Al element to a total of the Ti element and the Al element and satisfies $0.55 \leq x \leq 0.80$. When the atomic ratio x of the Al element in formula (1) above is 0.55 or more, the adhesion between the coating layer and the substrate is more effectively improved, and hence the fracture resistance of the coated cutting tool of the present embodiment is improved. Further, in the coating layer, when the atomic ratio x of the Al element in formula (1) above is 0.80 or less, formation of a nitride of Al, which is a hexagonal crystal, can be prevented, and a reduction in strength of the lower layer can thus be prevented. In particular, from the same perspective, x is preferably from 0.60 or more to 0.75 or less.

In the coated cutting tool of the present embodiment, the average thickness of the lower layer is from 0.1 μm or more to 1.0 μm or less. When the average thickness of the lower layer is 0.1 μm or more, the lower layer can uniformly cover the surface of the substrate, and hence the adhesion between the substrate and the coating layer is improved. Thus, the fracture resistance of the coated cutting tool of the present embodiment is improved. Meanwhile, when the average thickness of the lower layer is 1.0 μm or less, a reduction in strength of the lower layer can be prevented, and hence the fracture resistance of the coated cutting tool of the present embodiment is improved. In particular, from the same perspective as that set forth above, the average thickness of the lower layer is preferably from 0.1 μm or more to 0.7 μm or less.

In the coated cutting tool of the present embodiment, the average particle size of the particles forming the lower layer is from 0.01 μm or more to 0.05 μm or less. In the coated cutting tool of the present embodiment, when the average particle size of the particles forming the lower layer is 0.01 μm or more, a reduction in strength of the lower layer can be prevented, and the fracture resistance is thus improved, and when the average particle size of the particles forming the lower layer is 0.05 μm or less, the adhesion between the substrate and the coating layer is improved, and the fracture resistance is thus improved.

In the coated cutting tool of the present embodiment, the average particle size of the particles forming the lower layer can be obtained using a commercially available transmission electron microscope (TEM). For example, a thin-film sample having an observation surface being a cross-sectional surface of the coating layer is produced using a focused ion beam (FIB) machining apparatus, and a photograph of a scanning transmission electron microscope image (STEM image) is taken. A straight line is drawn on the taken photograph in a direction parallel to the surface of the substrate, and the number of the particles forming the lower layer is measured. The length of the straight line is divided by the number of particles, and the obtained value can be defined as an average particle size. Here, the length of the straight line is preferably 10 μm or more. Further, it is more preferred that average particle sizes in a plurality of field of views be obtained, the obtained values be divided by the number of field of views, and the obtained value be determined as the average particle size of the particles forming the lower layer.

In the present embodiment, the average particle size of the particles forming the lower layer is measured by a method described in Examples below.

In the coated cutting tool of the present embodiment, the upper layer contains the particles each having the composition represented by formula (2) below.

$$(Ti_{1-y}Al_y)(C_{1-z}N_z) \quad (2)$$

In the coated cutting tool of the present embodiment, when the coating layer includes, on the lower layer, the upper layer containing the particles each having the composition represented by formula (2) above, the wear resistance is improved. In formula (2) above, y denotes the atomic ratio of the Al element to a total of the Ti element and the Al element and satisfies 0≤y≤0.80. When the atomic ratio y of the Al element in formula (2) above is 0.80 or less, formation of a nitride of Al, which is a hexagonal crystal, can be prevented, and the wear resistance of the upper layer is thus improved. Meanwhile, when the atomic ratio y of the Al element in formula (2) above is more than 0 (that is, when Al is contained), oxidation resistance is improved, which prevents reaction wear. As a result, the fracture resistance of the coated cutting tool of the present embodiment is improved. In particular, when the coated cutting tool of the present embodiment is used in machining of hardened steel, the upper layer preferably contains the particles each having the composition represented by formula (3) below because the wear resistance is excellent in such a case.

$$Ti(C_{1-z}N_z) \quad (3)$$

Further, in formulae (2) and (3) above, z denotes the atomic ratio of the N element to a total of the C element and the N element and satisfies 0.65≤z<1.00. In the coated cutting tool of the present embodiment, when the atomic ratio z of the N element is 0.65 or more in formulae (2) and (3) above, the toughness of the upper layer is improved, and the fracture resistance is thus improved, and when the atomic ratio z of the N element is less than 1.00 in formulae (2) and (3) above, the hardness of the upper layer is more increased, and the wear resistance is thus improved. In particular, from the same perspective as that set forth above, in formulae (2) and (3) above, the atomic ratio z of the N element preferably satisfies 0.65≤z≤0.90.

In the coated cutting tool of the present embodiment, for example, when the composition of the coating layer is represented by $(Ti_{0.35}Al_{0.65})N$, such representation indicates that the atomic ratio of the Ti element to a total of the Ti element and the Al element is 0.35, and that the atomic ratio of the Al element to a total of the Ti element and the Al element is 0.65. That is, such representation indicates that the amount of the Ti element based on a total of the Ti element and the Al element is 35 atom %, and that the amount of the Al element based on a total of the Ti element and the Al element is 65 atom %.

In the coated cutting tool of the present embodiment, when the average thickness of the upper layer is 1.0 μm or more, the wear resistance is improved, and when the average thickness of the upper layer is 5.0 μm or less, a reduction in adhesion can be prevented, with the result that a reduction in fracture resistance can be prevented. Thus, in the coated cutting tool of the present embodiment, the average thickness of the upper layer is from 1.0 μm to 5.0 μm. In particular, from the same perspective as that set forth above, the average thickness of the upper layer is preferably from 1.5 μm to 5.0 μm.

In the coated cutting tool of the present embodiment, the average particle size of the particles forming the upper layer is preferably from 0.1 μm to 1.5 μm. In the coated cutting tool of the present embodiment, when the average particle size of the particles forming the upper layer is 0.1 μm or more, the wear resistance tends to be improved because the particles are prevented from being dropped out, which is preferred. Further, in the coated cutting tool of the present embodiment, when the average particle size of the particles forming the upper layer is 1.5 μm or less, cracks caused during machining is prevented from developing toward the substrate, and the fracture resistance is thus improved, which is preferred. Here, a particle size is a value of the shortest axis of the particles forming the upper layer. The particle size of each of the particles forming the upper layer is obtained, and the arithmetic mean thereof is defined as an average particle size.

In the coated cutting tool of the present embodiment, the average particle size of the particles forming the upper layer can be measured by preparing a cross-sectional structure surface of the coated cutting tool, and using an electron backscatter diffraction (EBSD), which comes with a scanning electron microscope (SEM), a field emission scanning electron microscope (FE-SEM), or the like. The coated cutting tool is mirror-polished in a direction vertical or substantially vertical to the surface of the substrate to obtain a cross-sectional structure surface. Examples of a method of obtaining a cross-sectional structure surface of the coated cutting tool can include: a polishing method with the use of diamond paste or colloidal silica; and ion milling. A sample that is the cross-sectional structure surface of the coated cutting tool is set to the FE-SEM, and the sample is irradiated with an electron beam with an acceleration voltage of 15 kV and an irradiation current of 0.5 nA at an incident angle of 70°. A cross-sectional structure in the flank of the coated cutting tool is preferably measured in a measurement range of 300 μm² with a step size of 0.1 μm by the EBSD. Here, a boundary having a misorientation of 5° or more is regarded as a grain boundary, and a region surrounded by the grain boundary is defined as a particle. With regard to the upper layer, the particle size of each specified particle can also be easily obtained. Thus, in the present embodiment, the average particle size of the particles forming the upper layer is measured by adopting a value obtained by the EBSD, and specifically, a method described in Examples below.

In the coated cutting tool of the present embodiment, the coating layer may include only the lower layer and the upper layer, but may also include an uppermost layer on the surface of the upper layer that is opposed to the substrate (that is, a layer formed on the upper layer). The uppermost layer preferably includes a compound formed of at least one element selected from the group consisting of Ti, Zr, Hf, V, Nb, Ta, Cr, Mo, W, Al, Si, and Y, and at least one element selected from the group consisting of C, N, O and, B because the wear resistance is much more excellent in such a case. Further, from the same perspective as that set forth above, the uppermost layer more preferably includes a compound formed of at least one element selected from the group consisting of Ti, Nb, Ta, Cr, Mo, W, Al, Si, and Y, and at least one element selected from the group consisting of C, N, O, and B. Moreover, the uppermost layer still more preferably includes a compound formed of at least one element selected from the group consisting of Ti, Nb, Ta, Cr, W, Al, Si, and Y, and at least one element selected from the group consisting of C and N. Further, the uppermost layer may be a single layer or a multilayer (laminate) of two or more layers.

In the coated cutting tool of the present embodiment, when the average thickness of the uppermost layer is from 0.1 μm or more to 3.5 μm or less, the wear resistance tends to be excellent, which is preferred. From the same perspective, the average thickness of the uppermost layer is more preferably from 0.2 μm or more to 2.0 μm or less, still more preferably from 0.3 μm or more to 1.0 μm or less.

In the coated cutting tool of the present embodiment, it is preferred that the compound forming the upper layer be a cubic crystal, and a ratio I (111)/I (200) between a peak intensity I (111) of a plane (111) of the upper layer and a peak intensity I (200) of a plane (200) of the upper layer in X-ray diffraction analysis be more than 1 and 15 or less.

Further, in the coated cutting tool of the present embodiment, the upper layer more preferably includes a crystal of (Ti,Al)(C,N) or Ti(C,N), which is a cubic crystal. Moreover, in the upper layer used in the coated cutting tool of the present embodiment, when the ratio [hereinafter referred to as "I (111)/I (200)"] between the diffraction peak intensity I (111) of the cubic crystal plane (111) and the diffraction peak intensity I (200) of the cubic crystal plane (200) by X-ray diffraction analysis is more than 1, the adhesion between the lower layer and the upper layer tends to be improved, and hence the fracture resistance of the coated cutting tool is improved, which is preferred. Meanwhile, the coated cutting tool of the present embodiment can be stably manufactured when the ratio I (111)/I (200) is 15 or less, which is preferred. With regard to the diffraction peak of Ti(C,N), a diffraction peak 2θ of a cubic crystal plane (111) is 36.18°, and a diffraction peak 2θ of a cubic crystal plane (200) is 42.02° in accordance with the ICDD card No. 00-042-1489. Further, with regard to (Ti,Al)(C,N), diffraction peaks 2θ can be specified in accordance with the ICDD card No. 00-042-1489 for Ti(C,N) and the ICDD card No. 00-071-5864 for (Ti,Al)N. A cubic crystal plane (111) of (Ti,Al)N has 2θ of 37.14°, and a cubic crystal plane (111) of Ti(C,N) has 2θ of 36.18°. That is, the diffraction peaks of the cubic crystal plane (111) of (Ti,Al)(C,N) present in the vicinity of a region where 2θ ranges from 36.18° to 37.14°. Further, in a similar manner, the cubic crystal plane (200) of (Ti,Al)N has 2θ of 43.15°, and the cubic crystal plane (200) of Ti(C,N) has 2θ of 42.02°. That is, the diffraction peaks of the cubic crystal plane (200) of (Ti,Al)(C,N) present in the vicinity of a region where 2θ ranges from 42.02° to 43.15°. The peak positions of the diffraction peaks are shifted by being affected by residual stress, compositions, or other factors.

In the coated cutting tool of the present embodiment, the peak intensity of each plane index in the upper layer can be obtained using a commercially available X-ray diffractometer. For example, the peak intensity of each plane index described above can be measured by measuring X-ray diffraction by a 2θ/θ focusing optical system with Cu-Kα radiation, using an X-ray diffractometer RINT TTRIII (trade name) manufactured by Rigaku Corporation under the following conditions. Here, the measurement conditions are as follows: an output: 50 kV and 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 25° to 70°. The peak intensity of each plane index described above may be obtained from an X-ray diffraction pattern using analysis software attached to the X-ray diffractometer. With analysis software, each peak intensity can be obtained through background processing and removal of a Kα2 peak with the use of a cubic spline, and profile fitting using the Pearson-VII function.

In the present embodiment, the peak intensity of each plane index in the upper layer is measured by a method described in Examples below.

When the lower layer affects the peak intensities, each peak intensity may be measured by thin-film X-ray diffraction.

In the coated cutting tool of the present embodiment, when the residual stress in the upper layer is compressed, the fracture resistance tends to be improved, which is preferred. In particular, in the coated cutting tool of the present embodiment, the residual stress value of the upper layer is preferably from −3.0 GPa higher to −0.1 GPa or lower. In the coated cutting tool of the present embodiment, when the value of residual stress in the upper layer is −3.0 GPa or higher, cracks can be prevented from being caused after the upper layer is formed, which is preferred. When the value of residual stress in the upper layer is −0.1 GPa or lower, fracturing of the coated cutting tool is more properly prevented, which is preferred.

The above-mentioned residual stress is internal stress (inherent strain) remaining in the upper layer. In general, stress represented by a "−" (negative) value is called compressive stress, whereas stress represented by a "+" (positive) value is called tensile stress. In the present embodiment, with regard to the magnitude of residual stress, the residual stress is represented as being large when a "+" (positive) value is large, whereas the residual stress is represented as being small when a "−" (negative) value is large.

The above-mentioned residual stress can be measured by the sinew method using an X-ray diffractometer, and is specifically measured by a method described in Examples below.

The residual stress can be measured by measuring stresses at any three points in a section involved in cutting (these points are preferably selected to have a distance of 0.5 mm or more therebetween so that the points can represent stress in the section) by the sinew method, and obtaining the average value thereof.

In the coated cutting tool of the present embodiment, a method of manufacturing the coating layer is not particularly limited. Examples of the method include physical vapor deposition methods, such as an ion plating method, an arc ion plating method, a sputtering method, and an ion mixing method. The coating layer is preferably formed by a physical vapor deposition method because sharp edges can be formed. In particular, the arc ion plating method achieves excellent adhesion between the coating layer and the substrate, and is thus more preferred.

A method of manufacturing a coated cutting tool of the present embodiment will now be described using specific examples. It should be noted that the method of manufacturing a coated cutting tool of the present embodiment is not particularly limited, as long as the configurations of the coated cutting tool may be achieved.

In the coated cutting tool of the present embodiment, the substrate made of the cubic boron nitride-containing sintered body can be manufactured by any method, and, for example, by a method including the following steps (A) to (H).

Step (A): 50 volume % to 90 volume % of cubic boron nitride and 10 volume % to 50 volume % of powder of a binder phase are mixed (a total of these values is 100 volume %). The powder of the binder phase preferably contains at least one metal element selected from the group consisting of Ti, Zr, Hf, V, Nb, Ta, Cr, Mo, W, Al, and Co. Alternatively, the powder of the binder phase preferably contains a compound formed of at least one metal element selected from the group consisting of Ti, Zr, Hf, V, Nb, Ta, Cr, Mo, W, Al, and Co, and at least one element selected from the group consisting of carbon, nitrogen, oxygen, and boron.

Step (B): the raw material powder obtained in step (A) is mixed with cemented carbide balls for 5 hours to 24 hours by means of a wet ball mill.

Step (C): the mixture obtained in step (B) is molded into a predetermined shape to obtain a molded body.

Step (D): the molded body obtained in step (C) is sintered by being held in an ultrahigh-pressure generator with a pressure from 4.0 GPa to 7.0 GPa at a sintering temperature ranging from 1,300° C. to 1,500° C. for predetermined time.

Step (E): the sintered body obtained in step (D) is cut out by an electric discharge machine so as to match a tool shape.

Step (F): a substrate made of a cemented carbide is prepared.

Step (G): the sintered body cut out in step (E) is joined to the substrate prepared in step (F) by brazing, for example.

Step (H): the tool obtained in step (G) is subjected to honing.

The average particle size of the particles of cubic boron nitride in the cubic boron nitride-containing sintered body used in the present embodiment may be set to a desired value by appropriately adjusting the average particle size of the particles of cubic boron nitride, which is a raw material, in a process of manufacturing the above-mentioned substrate (for example, in step (B)), for example.

The coating layer used in the present embodiment can be manufactured by any method, and, for example, by the following method.

A substrate machined into a tool shape is received in a reactor of a physical vapor deposition apparatus, and metal evaporation sources are placed in the reactor. Thereafter, the reactor is evacuated until the pressure therein indicates a vacuum of $1.0 \times 10^{-2}$ Pa or lower, and the substrate is heated, by a heater in the reactor, until the temperature thereof reaches from 200° C. to 800° C. After the heating, an argon gas (Ar) is introduced into the reactor so that the pressure is from 0.5 Pa to 5.0 Pa. In the Ar atmosphere with a pressure from 0.5 Pa to 5.0 Pa, a bias voltage from −500 V to −200 V is applied to the substrate, and a current from 40 A to 50 A is caused to flow through a tungsten filament in the reactor, whereby an ion bombardment process is carried out, with the Ar gas, on the surface of the substrate. After the ion bombardment process is carried out on the substrate surface, the reactor is evacuated until the pressure therein indicates a vacuum of $1.0 \times 10^{-2}$ Pa or lower.

Then, the substrate is controlled so that the temperature thereof reaches from 350° C. to 700° C. A nitrogen gas ($N_2$), or $N_2$ and Ar are introduced into the reactor, and the pressure in the reactor is adjusted so as to be from 2.0 Pa to 5.0 Pa. Thereafter, a bias voltage from −120 V to −30 V is applied to the substrate, and a metal evaporation source according to the metal components of each layer is evaporated via an arc discharge from 80 A to 200 A, whereby formation of the lower layer on the substrate surface starts.

After the formation of the lower layer, the substrate is controlled so that the temperature thereof reaches from 350° C. to 700° C. Ar, $N_2$, and an acetylene gas ($C_2H_2$) are introduced into the reactor so that the pressure in the reactor reaches from 2.0 Pa to 5.0 Pa. Thereafter, a bias voltage from −150 V to −30 V is applied to the substrate, and a metal evaporation source according to the metal components of each layer is evaporated via an arc discharge from 80 A to 200 A, whereby formation of the upper layer on the surface of the lower layer starts.

The average particle size of the particles forming the lower layer used in the present embodiment may be set to a desired value by controlling the temperature of the substrate in the above-mentioned process of forming a lower layer, for example. As the temperature of the substrate increases, the average particle size of the particles forming the lower layer tends to decrease. Thus, the average particle size can be controlled by adjusting the temperature of the substrate. Further, when a metal evaporation source in which the atomic ratio of the Al element to a total of the Ti element and the Al element in the lower layer is large, the average particle size of the particles forming the lower layer tends to decrease. Thus, the average particle size of the particles forming the lower layer can be controlled by adjusting the temperature of the substrate and the composition of the metal evaporation source.

The average particle size of the particles forming the upper layer used in the present embodiment may be set to a desired value by controlling the temperature of the substrate in the above-mentioned process of forming an upper layer, for example. As the temperature of the substrate increases, the average particle size of the particles forming the upper layer tends to decrease. Thus, the average particle size can be controlled by adjusting the temperature of the substrate. Further, when a metal evaporation source in which the atomic ratio of the Al element to a total of the Ti element and the Al element in the upper layer is large, the average particle size of the particles forming the upper layer tends to decrease. Thus, the average particle size of the particles forming the upper layer can be controlled by adjusting the temperature of the substrate and the composition of the metal evaporation source.

In the upper layer used in the present embodiment, the atomic ratio z of the N element to a total of the C element and the N element of the composition represented by $(Ti_{1-y}Al_y)(C_{1-z}N_z)$ may be set to a desired value by controlling the volume ratios of Ar, $N_2$, and $C_2H_2$ introduced into the reactor, in the above-mentioned process of forming an upper layer, for example. As the ratio of $C_2H_2$ increases, the atomic ratio z tends to decrease. More specifically, for example, when a case where the volume ratio of Ar:$N_2$:$C_2H_2$ is 40:50:10 and a case where the volume ratio of Ar:$N_2$:$C_2H_2$ is 40:40:20 are compared to each other, in the case where the volume ratio is 40:40:20, the ratio of $C_2H_2$ is high and the atomic ratio z is thus small.

The residual stress in the upper layer used in the present embodiment may be set to a predetermined value by controlling the absolute value of the bias voltage applied to the substrate, in the above-mentioned process of forming an upper layer, for example. As the absolute value of the bias voltage applied to the substrate increases, the compressive stress applied to the upper layer tends to increase. More specifically, when a case where the bias voltage is −50 V and a case where the bias voltage is −100 V are compared to each other, in the case where the bias voltage is −100 V, the absolute value of the bias voltage is large and the compressive stress applied to the upper layer is large. Thus, the residual stress can be controlled by adjusting the bias voltage.

The ratio I (111)/I (200) of the upper layer used in the present embodiment may be set to a predetermined value by controlling current in the above-mentioned process of forming an upper layer, for example. As the current increases, the ratio I (111)/I (200) tends to increase. More specifically, for example, when a case where a current is 50 A and a case where a current is 100 A are compared to each other, the current is large in the case where the current is 100 A. Thus, the ratio I (111)/I (200) of the upper layer increases. In this way, the residual stress can be controlled by adjusting the current.

The thickness of each layer forming the coating layer used in the coated cutting tool of the present embodiment can be measured from a cross-sectional structure of the coated cutting tool using an optical microscope, a scanning electron microscope (SEM), a transmission electron microscope (TEM), or the like. The average thickness of each layer used in the coated cutting tool of the present embodiment can be obtained by measuring the thickness of each layer from cross-sectional surfaces at three or more locations near the position 50 μm from the edge of a surface facing the metal evaporation source, toward the center of the surface, and calculating the average value (arithmetic mean) thereof. Specifically, the average thickness of each layer can be obtained by a method described in Examples below.

Further, the composition of each layer forming the coating layer used in the coated cutting tool of the present embodiment can be measured from a cross-sectional structure of the coated cutting tool of the present embodiment using an energy dispersive X-ray spectrometry (EDS) apparatus, a wavelength dispersive X-ray spectroscopy (WDS) apparatus, or the like. In the present embodiment, the composition of each layer forming the coating layer is measured by a method described in Examples below.

It is considered that the coated cutting tool of the present embodiment has excellent wear resistance and fracture resistance, and hence provides an effect to achieve a longer tool life than conventional coated cutting tools (factors for enabling the tool life to be extended are not limited to the matters described above). The types of the coated cutting tool of the present embodiment are not particularly limited, and can include, specifically, indexable cutting insert for milling or turning, a drill, and an end mill, for example.

Example

Now, the present invention is more specifically described by means of Examples, but the present invention is not limited to Examples.

EXAMPLES AND COMPARATIVE EXAMPLES

As substrates, tools of invention samples 1 to 30 and comparative samples 1 to 15 having compositions shown in Table 1 and Table 2 were manufactured by a method including steps (1) to (8) set forth below using raw materials having the compositions shown in Table 1 and Table 2. Here, the tools were machined into an ISO certified CNGA120408 shape.

Step (1): 55 volume % to 90 volume % of cubic boron nitride and 10 volume % to 45 volume % of powder of a binder phase were mixed (a total of these values was 100 volume %).

Step (2): the raw material powder obtained in step (1) was mixed with cemented carbide balls for 12 hours by means of a wet ball mill.

Step (3): the mixture obtained in step (2) was molded into a predetermined shape to obtain a molded body.

Step (4): the molded body obtained in step (3) was sintered by being held in an ultrahigh-pressure generator with a pressure of 6.0 GPa at a sintering temperature of 1,300° C. for 1 hour.

Step (5): the sintered body obtained in step (4) was cut out by an electric discharge machine so as to match the above-mentioned tool shape.

Step (6): a substrate made of a cemented carbide was prepared.

Step (7): the sintered body cut out in step (5) was joined to the substrate prepared in step (6) by brazing.

Step (8): the tool obtained in step (7) was subjected to honing.

TABLE 1

| Sample No. | Composition of raw material (volume %) | Cubic boron nitride-containing sintered body ||| 
|---|---|---|---|---|
| | | Cubic boron nitride (volume %) | Binder phase ||
| | | | Composition | (volume %) |
| Invention sample 1 | 65% cBN, 10% TiN, 3% TiC, 2% Ti(C,N), 3% TiB$_2$, 15% Al$_2$O$_3$, 2% WC | 65 | TiN, TiC, Ti(C,N), TiB$_2$, Al$_2$O$_3$, AlN, WC | 35 |
| Invention sample 2 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 3 | 85% cBN, 3% TiN, 1% TiB$_2$, 10% Al$_2$O$_3$, 1% WC | 85 | TiN, Ti(C,N), TiB$_2$, Al$_2$O$_3$, AlN, WC | 15 |
| Invention sample 4 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 5 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 6 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |

TABLE 1-continued

| Sample No. | Composition of raw material (volume %) | Cubic boron nitride (volume %) | Binder phase Composition | (volume %) |
|---|---|---|---|---|
| Invention sample 7 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 8 | 65% cBN, 10% TiN, 3% TiC, 2% Ti(C,N), 3% TiB$_2$, 15% Al$_2$O$_3$, 2% WC | 65 | TiN, TiC, Ti(C,N), TiB$_2$, Al$_2$O$_3$, AlN, WC | 35 |
| Invention sample 9 | 65% cBN, 10% TiN, 3% TiC, 2% Ti(C,N), 3% TiB$_2$, 15% Al$_2$O$_3$, 2% WC | 65 | TiN, TiC, Ti(C,N), TiB$_2$, Al$_2$O$_3$, AlN, WC | 35 |
| Invention sample 10 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 11 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 12 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 13 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 14 | 85% cBN, 3% TiN, 1% TiB$_2$, 10% Al$_2$O$_3$, 1% WC | 85 | TiN, Ti(C,N), TiB$_2$, Al$_2$O$_3$, AlN, WC | 15 |
| Invention sample 15 | 85% cBN, 3% TiN, 1% TiB$_2$, 10% Al$_2$O$_3$, 1% WC | 85 | TiN, Ti(C,N), TiB$_2$, Al$_2$O$_3$, AlN, WC | 15 |
| Invention sample 16 | 75% cBN, 5% ZrO$_2$, 15% Al$_2$O$_3$, % Al | 75 | ZrO$_2$, ZrN, ZrB$_2$, Al$_2$O$_3$ | 25 |
| Invention sample 17 | 75% cBN, 5% ZrO$_2$, 15% Al$_2$O$_3$, % Al | 75 | ZrO$_2$, ZrN, ZrB$_2$, Al$_2$O$_3$ | 25 |
| Invention sample 18 | 75% cBN, 3% TiN, 3% Ti(C,N), 1% TiB$_2$, 15% Al$_2$O$_3$, 2% WC | 75 | TiN, Ti(C,N), TiB$_2$, Al$_2$O$_3$, AlN, WC | 25 |
| Invention sample 19 | 75% cBN, 3% TiN, 3% Ti(C,N), 1% TiB$_2$, 15% Al$_2$O$_3$, 2% WC | 75 | TiN, Ti(C,N), TiB$_2$, Al$_2$O$_3$, AlN, WC | 25 |
| Invention sample 20 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 21 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 22 | 70% cBN, 20% Al$_2$O$_3$, 10% Si$_3$N$_4$ | 70 | Al$_2$O$_3$, Si$_3$N$_4$ | 30 |
| Invention sample 23 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Invention sample 24 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Invention sample 25 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Invention sample 26 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Invention sample 27 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Invention sample 28 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Invention sample 29 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Invention sample 30 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |

TABLE 2

| Sample No. | Composition of raw material (volume %) | Cubic boron nitride (volume %) | Binder phase Composition | (volume %) |
|---|---|---|---|---|
| Comparative sample 1 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 2 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 3 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 4 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |

TABLE 2-continued

| | | Cubic boron nitride-containing sintered body | | |
|---|---|---|---|---|
| Sample No. | Composition of raw material (volume %) | Cubic boron nitride (volume %) | Binder phase Composition | (volume %) |
| Comparative sample 5 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 6 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 7 | 55% cBN, 15% TiN, 8% TiC, 2% Ti(C,N), 3% TiB$_2$, 15% Al$_2$O$_3$, 2% WC | 55 | TiN, TiC, Ti(C,N), TiB$_2$, Al$_2$O$_3$, AlN, WC | 45 |
| Comparative sample 8 | 90% cBN, 1% Co, 1% Cr, 4% Ni, 4% Al$_2$O$_3$ | 90 | Co, Cr, Ni, Al$_2$O$_3$ | 10 |
| Comparative sample 9 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 10 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Comparative sample 11 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 12 | 65% cBN, 10% TiN, 3% TiC, 2% Ti(C,N), 3% TiB$_2$, 15% Al$_2$O$_3$, 2% WC | 65 | TiN, TiC, Ti(C,N), TiB$_2$, Al$_2$O$_3$, AlN, WC | 35 |
| Comparative sample 13 | 85% cBN, 3% TiN, 1% TiB$_2$, 10% Al$_2$O$_3$, 1% WC | 85 | TiN, Ti(C,N), TiB$_2$, Al$_2$O$_3$, AlN, WC | 15 |
| Comparative sample 14 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Comparative sample 15 | 75% cBN, 3% TiN, 3% Ti(C,N), 2% TiB$_2$, 15% Al$_2$O$_3$, 2% WC | 75 | TiN, Ti(C,N), TiB$_2$, Al$_2$O$_3$, AlN, WC | 25 |
| Comparative sample 16 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 17 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |
| Comparative sample 18 | 70% cBN, 5% TiN, 5% Ti(C,N), 3% TiB$_2$, 15% Al$_2$O$_3$, 2% WC | 70 | TiN, Ti(C,N), TiB$_2$, Al$_2$O$_3$, AlN, WC | 30 |

In the above-mentioned manufactured substrate, the composition of a binder phase contained in the cubic boron nitride-containing sintered body was identified by an X-ray diffractometer.

Metal evaporation sources were placed in a reactor of an arc ion plating apparatus so that each layer had a composition shown in Table 5 and Table 6. The above-mentioned manufactured substrate was fixed to a fixation fitting of a rotating table.

Thereafter, the reactor was evacuated until the pressure therein indicated a vacuum of 5.0×10$^{-3}$ Pa or lower. After the evacuation, the substrate was heated, by a heater in the reactor, until the temperature thereof reached 450° C. After the heating, an argon gas (Ar) was introduced into the reactor so that the pressure reached 2.7 Pa.

In the Ar atmosphere with a pressure of 2.7 Pa, a bias voltage of −400 V was applied to the substrate, and a current of 40 A was caused to flow through a tungsten filament in the reactor, whereby an ion bombardment process was carried out on the surface of the substrate with Ar for 30 minutes. After the ion bombardment process was carried out, the reactor was evacuated until the pressure therein indicates a vacuum of 5.0×10$^{-3}$ Pa or lower.

After the evacuation, the substrate was adjusted so that the temperature thereof reached a temperature (temperature at the start of film formation) shown in Table 3 and Table 4, and N$_2$ was introduced into the reactor so that the reactor was adjusted to have a pressure shown in Table 3 and Table 4.

Thereafter, a bias voltage shown in Table 3 and Table 4 was applied to the substrate, and a metal evaporation source was evaporated via an arc discharge with a current shown in Table 3 and Table 4 to achieve a composition shown Table 5 and Table 6, whereby a lower layer or a first layer was formed on the surface of the substrate.

After the formation of the lower layer or the first layer, the substrate was adjusted so that the temperature thereof reached a temperature (temperature at the start of film formation) shown in Table 3 and Table 4, and Ar, a nitrogen gas (N$_2$), and an acetylene gas (C$_2$H$_2$) were introduced into the reactor to achieve a volume ratio shown in Table 3 and Table 4, thereby adjusting the pressure in the reactor to a pressure shown in Table 3 and Table 4.

Then, a bias voltage shown in Table 3 and Table 4 was applied to the substrate, and a metal evaporation source was evaporated via an arc discharge with a current shown in Table 3 and Table 4 to achieve a composition shown Table 5 and Table 6, whereby an upper layer or a second layer was formed on the surface of the substrate.

Each layer was formed on the surface of the substrate to have a predetermined average thickness shown in Table 5 and Table 6, and a coated cutting tool was thus manufactured. Thereafter, the heater was powered off, and the sample (coated cutting tool) was taken out of the reactor after the temperature of the sample (coated cutting tool) reached 100° C. or lower.

The average thickness of each layer of the obtained sample (coated cutting tool) was obtained by observing, with a SEM, cross-sectional surfaces at three locations near the position 50 μm from the edge of a surface of the coated cutting tool facing the metal evaporation source, toward the center of the surface to measure the thickness of each layer, and calculating the average value (arithmetic mean) thereof. The composition of each layer of the obtained sample (coated cutting tool) was measured using an EDS from a cross-sectional surface near the position 50 μm from the edge of a surface of the coated cutting tool facing the metal evaporation source, toward the center of the surface. The results are also shown in Table 5 and Table 6. A composition ratio of metal elements of each layer shown in Table 5 and Table 6 denotes the atomic ratio of each metal element with respect to the entire metal element of a metal compound forming each layer.

TABLE 3

| | Lower layer | | | | Upper layer | | | | |
|---|---|---|---|---|---|---|---|---|---|
| Sample No. | Temperature (° C.) | Pressure (Pa) | Voltage (V) | Current (A) | Temperature (° C.) | Pressure (Pa) | Voltage (V) | Current (A) | Ar:$N_2$:$C_2H_2$ |
| Invention sample 1 | 500 | 3.0 | −60 | 120 | 500 | 3.0 | −60 | 120 | 40:45:15 |
| Invention sample 2 | 500 | 3.0 | −60 | 120 | 500 | 3.0 | −60 | 120 | 40:45:15 |
| Invention sample 3 | 500 | 3.0 | −60 | 120 | 500 | 3.0 | −60 | 120 | 40:45:15 |
| Invention sample 4 | 600 | 3.0 | −60 | 120 | 500 | 3.0 | −60 | 120 | 40:45:15 |
| Invention sample 5 | 350 | 3.0 | −60 | 120 | 500 | 3.0 | −60 | 120 | 40:45:15 |
| Invention sample 6 | 500 | 3.0 | −60 | 120 | 500 | 3.0 | −60 | 120 | 45:50:5 |
| Invention sample 7 | 500 | 3.0 | −60 | 120 | 500 | 3.0 | −60 | 120 | 35:40:25 |
| Invention sample 8 | 500 | 3.0 | −60 | 80 | 500 | 3.0 | −60 | 120 | 40:45:15 |
| Invention sample 9 | 500 | 3.0 | −60 | 80 | 500 | 3.0 | −60 | 120 | 40:45:15 |
| Invention sample 10 | 500 | 3.0 | −60 | 80 | 500 | 3.0 | −60 | 120 | 40:45:15 |
| Invention sample 11 | 500 | 3.0 | −60 | 80 | 500 | 3.0 | −60 | 120 | 40:45:15 |
| Invention sample 12 | 500 | 3.0 | −60 | 80 | 500 | 3.0 | −60 | 120 | 40:45:15 |
| Invention sample 13 | 500 | 3.0 | −60 | 80 | 500 | 3.0 | −60 | 120 | 40:45:15 |
| Invention sample 14 | 600 | 3.0 | −60 | 80 | 500 | 3.0 | −60 | 120 | 40:45:15 |
| Invention sample 15 | 400 | 3.0 | −60 | 80 | 500 | 3.0 | −60 | 120 | 40:45:15 |
| Invention sample 16 | 500 | 3.0 | −60 | 80 | 650 | 3.0 | −60 | 100 | 40:45:15 |
| Invention sample 17 | 500 | 3.0 | −40 | 80 | 400 | 3.0 | −60 | 100 | 40:45:15 |
| Invention sample 18 | 500 | 3.0 | −40 | 80 | 400 | 3.0 | −45 | 180 | 40:45:15 |
| Invention sample 19 | 500 | 3.0 | −40 | 80 | 400 | 3.0 | −100 | 180 | 40:45:15 |
| Invention sample 20 | 500 | 3.0 | −40 | 120 | 500 | 3.0 | −45 | 130 | 40:45:15 |
| Invention sample 21 | 500 | 3.0 | −40 | 120 | 500 | 3.0 | −45 | 130 | 40:45:15 |
| Invention sample 22 | 450 | 3.0 | −40 | 120 | 500 | 3.0 | −70 | 130 | 40:45:15 |
| Invention sample 23 | 350 | 3.0 | −40 | 120 | 500 | 3.0 | −70 | 130 | 35:40:25 |
| Invention sample 24 | 400 | 3.0 | −40 | 120 | 500 | 3.0 | −70 | 130 | 35:40:25 |
| Invention sample 25 | 400 | 3.0 | −40 | 120 | 550 | 3.0 | −70 | 130 | 40:45:15 |
| Invention sample 26 | 400 | 3.0 | −40 | 120 | 550 | 3.0 | −45 | 130 | 45:50:5 |
| Invention sample 27 | 400 | 3.0 | −40 | 120 | 550 | 3.0 | −45 | 130 | 45:50:5 |
| Invention sample 28 | 400 | 3.0 | −40 | 120 | 450 | 3.0 | −45 | 130 | 45:50:5 |
| Invention sample 29 | 500 | 3.0 | −60 | 120 | 350 | 3.0 | −150 | 80 | 40:45:15 |
| Invention sample 30 | 500 | 3.0 | −60 | 120 | 350 | 3.0 | −30 | 80 | 40:45:15 |

TABLE 4

| | First layer | | | | Second layer | | | | |
|---|---|---|---|---|---|---|---|---|---|
| Sample No. | Temperature (° C.) | Pressure (Pa) | Voltage (V) | Current (A) | Temperature (° C.) | Pressure (Pa) | Voltage (V) | Current (A) | Ar:$N_2$:$C_2H_2$ |
| Comparative sample 1 | 500 | 3.0 | −60 | 120 | 500 | 3.0 | −60 | 120 | 40:45:15 |
| Comparative sample 2 | 500 | 3.0 | −60 | 120 | 500 | 3.0 | −60 | 120 | 40:45:15 |
| Comparative sample 3 | 500 | 3.0 | −60 | 120 | 500 | 3.0 | −60 | 120 | 40:45:15 |
| Comparative sample 4 | 500 | 3.0 | −60 | 120 | 500 | 3.0 | −60 | 120 | 40:45:15 |
| Comparative sample 5 | 500 | 3.0 | −60 | 120 | 500 | 3.0 | −60 | 120 | 40:45:15 |
| Comparative sample 6 | 300 | 3.0 | −60 | 120 | 500 | 3.0 | −60 | 120 | 40:45:15 |
| Comparative sample 7 | 500 | 3.0 | −60 | 120 | 500 | 3.0 | −60 | 120 | 40:45:15 |
| Comparative sample 8 | 500 | 3.0 | −60 | 120 | 500 | 3.0 | −60 | 120 | 40:45:15 |
| Comparative sample 9 | 500 | 3.0 | −60 | 80 | 500 | 3.0 | −45 | 130 | 10:90 |
| Comparative sample 10 | 500 | 3.0 | −60 | 80 | 550 | 3.0 | −70 | 130 | 40:45:15 |
| Comparative sample 11 | — | — | — | — | 500 | 3.0 | −45 | 120 | 40:45:15 |
| Comparative sample 12 | 500 | 3.0 | −40 | 80 | 500 | 3.0 | −45 | 120 | 10:90 |
| Comparative sample 13 | 400 | 3.0 | −40 | 80 | 500 | 3.0 | −45 | 120 | 40:45:15 |
| Comparative sample 14 | 600 | 3.0 | −40 | 120 | 500 | 3.0 | −70 | 130 | 35:40:25 |
| Comparative sample 15 | 650 | 3.0 | −40 | 120 | 550 | 3.0 | −70 | 130 | 40:45:15 |
| Comparative sample 16 | 300 | 3.0 | −60 | 120 | 500 | 3.0 | −60 | 120 | 40:45:15 |
| Comparative sample 17 | 600 | 3.0 | −60 | 120 | 500 | 3.0 | −60 | 120 | 40:45:15 |
| Comparative sample 18 | 500 | 3.0 | −60 | 120 | 300 | 3.0 | −60 | 120 | 40:45:15 |

*For convenience sake, "—" of comparative sample 11 represents that the first layer is not formed.

TABLE 5

| Sample No. | Coating layer - Lower layer Composition | Lower layer Average thickness (μm) | Upper layer Composition | Upper layer Average thickness (μm) | Average thickness of entire coating layer (μm) |
|---|---|---|---|---|---|
| Invention sample 1 | $(Ti_{0.35}Al_{0.65})N$ | 0.5 | $Ti(C_{0.20}N_{0.80})$ | 3.0 | 3.5 |
| Invention sample 2 | $(Ti_{0.35}Al_{0.65})N$ | 0.5 | $Ti(C_{0.20}N_{0.80})$ | 3.0 | 3.5 |
| Invention sample 3 | $(Ti_{0.35}Al_{0.65})N$ | 0.5 | $Ti(C_{0.20}N_{0.80})$ | 3.0 | 3.5 |
| Invention sample 4 | $(Ti_{0.45}Al_{0.55})N$ | 0.5 | $Ti(C_{0.20}N_{0.80})$ | 3.0 | 3.5 |
| Invention sample 5 | $(Ti_{0.25}Al_{0.75})N$ | 0.5 | $Ti(C_{0.20}N_{0.80})$ | 3.0 | 3.5 |
| Invention sample 6 | $(Ti_{0.35}Al_{0.65})N$ | 0.5 | $Ti(C_{0.05}N_{0.95})$ | 3.0 | 3.5 |
| Invention sample 7 | $(Ti_{0.35}Al_{0.65})N$ | 0.5 | $Ti(C_{0.35}N_{0.65})$ | 3.0 | 3.5 |
| Invention sample 8 | $(Ti_{0.35}Al_{0.65})N$ | 0.1 | $Ti(C_{0.20}N_{0.80})$ | 3.4 | 3.5 |
| Invention sample 9 | $(Ti_{0.35}Al_{0.65})N$ | 1.0 | $Ti(C_{0.20}N_{0.80})$ | 2.5 | 3.5 |
| Invention sample 10 | $(Ti_{0.35}Al_{0.65})N$ | 1.0 | $Ti(C_{0.20}N_{0.80})$ | 1.0 | 2.0 |
| Invention sample 11 | $(Ti_{0.35}Al_{0.65})N$ | 1.0 | $Ti(C_{0.20}N_{0.80})$ | 5.0 | 6.0 |
| Invention sample 12 | $(Ti_{0.35}Al_{0.65})N$ | 0.5 | $Ti(C_{0.20}N_{0.80})$ | 3.0 | 3.5 |
| Invention sample 13 | $(Ti_{0.35}Al_{0.65})N$ | 0.5 | $Ti(C_{0.20}N_{0.80})$ | 3.0 | 3.5 |
| Invention sample 14 | $(Ti_{0.35}Al_{0.65})N$ | 0.5 | $Ti(C_{0.20}N_{0.80})$ | 3.0 | 3.5 |
| Invention sample 15 | $(Ti_{0.35}Al_{0.65})N$ | 0.5 | $Ti(C_{0.20}N_{0.80})$ | 3.0 | 3.5 |
| Invention sample 16 | $(Ti_{0.35}Al_{0.65})N$ | 0.5 | $Ti(C_{0.20}N_{0.80})$ | 3.0 | 3.5 |
| Invention sample 17 | $(Ti_{0.35}Al_{0.65})N$ | 0.5 | $Ti(C_{0.20}N_{0.80})$ | 3.0 | 3.5 |
| Invention sample 18 | $(Ti_{0.35}Al_{0.65})N$ | 0.5 | $Ti(C_{0.20}N_{0.80})$ | 3.0 | 3.5 |
| Invention sample 19 | $(Ti_{0.35}Al_{0.65})N$ | 0.5 | $Ti(C_{0.20}N_{0.80})$ | 3.0 | 3.5 |
| Invention sample 20 | $(Ti_{0.35}Al_{0.65})N$ | 0.5 | $(Ti_{0.40}Al_{0.60})(C_{0.20}N_{0.80})$ | 3.0 | 3.5 |
| Invention sample 21 | $(Ti_{0.35}Al_{0.65})N$ | 0.5 | $(Ti_{0.60}Al_{0.40})(C_{0.20}N_{0.80})$ | 3.0 | 3.5 |
| Invention sample 22 | $(Ti_{0.30}Al_{0.70})N$ | 0.3 | $Ti(C_{0.20}N_{0.80})$ | 4.0 | 4.3 |
| Invention sample 23 | $(Ti_{0.30}Al_{0.70})N$ | 0.3 | $Ti(C_{0.35}N_{0.65})$ | 3.2 | 3.5 |
| Invention sample 24 | $(Ti_{0.30}Al_{0.70})N$ | 0.1 | $Ti(C_{0.35}N_{0.65})$ | 4.2 | 4.3 |
| Invention sample 25 | $(Ti_{0.30}Al_{0.70})N$ | 0.1 | $(Ti_{0.60}Al_{0.40})(C_{0.20}N_{0.80})$ | 4.2 | 4.3 |
| Invention sample 26 | $(Ti_{0.30}Al_{0.70})N$ | 0.1 | $Ti(C_{0.05}N_{0.95})$ | 4.2 | 4.3 |
| Invention sample 27 | $(Ti_{0.30}Al_{0.70})N$ | 0.1 | $Ti(C_{0.05}N_{0.95})$ | 4.2 | 4.3 |
| Invention sample 28 | $(Ti_{0.30}Al_{0.70})N$ | 0.7 | $Ti(C_{0.05}N_{0.95})$ | 4.2 | 4.9 |
| Invention sample 29 | $(Ti_{0.35}Al_{0.65})N$ | 0.5 | $Ti(C_{0.20}N_{0.80})$ | 3.0 | 3.5 |
| Invention sample 30 | $(Ti_{0.35}Al_{0.65})N$ | 0.5 | $Ti(C_{0.20}N_{0.80})$ | 3.0 | 3.5 |

TABLE 6

| Sample No. | First layer Composition | First layer Average thickness (μm) | Second layer Composition | Second layer Average thickness (μm) | Average thickness of entire coating layer (μm) |
|---|---|---|---|---|---|
| Comparative sample 1 | TiN | 0.5 | $Ti(C_{0.20}N_{0.80})$ | 3.0 | 3.5 |
| Comparative sample 2 | $(Ti_{0.35}Al_{0.65})N$ | 2.0 | $Ti(C_{0.20}N_{0.80})$ | 1.5 | 3.5 |
| Comparative sample 3 | $(Ti_{0.35}Al_{0.65})N$ | 0.5 | $Ti(C_{0.20}N_{0.80})$ | 8.0 | 8.5 |
| Comparative sample 4 | $(Ti_{0.35}Al_{0.65})N$ | 0.5 | $Ti(C_{0.20}N_{0.80})$ | 3.0 | 3.5 |
| Comparative sample 5 | $(Ti_{0.35}Al_{0.65})N$ | 0.5 | $Ti(C_{0.20}N_{0.80})$ | 3.0 | 3.5 |
| Comparative sample 6 | $(Ti_{0.35}Al_{0.65})N$ | 0.5 | $Ti(C_{0.20}N_{0.80})$ | 3.0 | 3.5 |
| Comparative sample 7 | $(Ti_{0.35}Al_{0.65})N$ | 0.5 | $Ti(C_{0.20}N_{0.80})$ | 3.0 | 3.5 |
| Comparative sample 8 | $(Ti_{0.35}Al_{0.65})N$ | 0.5 | $Ti(C_{0.20}N_{0.80})$ | 3.0 | 3.5 |
| Comparative sample 9 | $(Ti_{0.35}Al_{0.65})N$ | 0.5 | $(Ti_{0.60}Al_{0.40})N$ | 3.0 | 3.5 |
| Comparative sample 10 | TiN | 0.1 | $(Ti_{0.60}Al_{0.40})(C_{0.20}N_{0.80})$ | 4.2 | 4.3 |
| Comparative sample 11 | — | — | $Ti(C_{0.20}N_{0.80})$ | 3.5 | 3.5 |
| Comparative sample 12 | $(Ti_{0.35}Al_{0.65})N$ | 1.0 | $(Ti_{0.60}Al_{0.40})N$ | 2.5 | 3.5 |
| Comparative sample 13 | $(Ti_{0.35}Al_{0.65})N$ | 0.5 | $Ti(C_{0.20}N_{0.80})$ | 3.0 | 3.5 |
| Comparative sample 14 | $(Al_{0.50}Cr_{0.50})N$ | 0.1 | $Ti(C_{0.35}N_{0.65})$ | 4.2 | 4.3 |
| Comparative sample 15 | $Ti(C_{0.20}N_{0.80})$ | 0.5 | $(Ti_{0.60}Al_{0.40})(C_{0.20}N_{0.80})$ | 3.8 | 4.3 |
| Comparative sample 16 | $(Ti_{0.15}Al_{0.85})N$ | 0.5 | $Ti(C_{0.20}N_{0.80})$ | 3.0 | 3.5 |
| Comparative sample 17 | $(Ti_{0.50}Al_{0.50})N$ | 0.5 | $Ti(C_{0.20}N_{0.80})$ | 3.0 | 3.5 |
| Comparative sample 18 | $(Ti_{0.35}Al_{0.65})N$ | 0.5 | $(Ti_{0.15}Al_{0.85})N$ | 3.0 | 3.5 |

*For convenience sake, "—" of comparative sample 11 represents that the first layer is not formed.

With regard to the obtained sample (coated cutting tool), X-ray diffraction by a 2θ/θ focusing optical system with Cu-Kα radiation was measured under the following conditions: an output: 50 kV and 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 25° to 70°. As the apparatus, the X-ray diffractometer RINT TTRIII (trade name) manufactured by Rigaku Corporation was used. The peak intensity of each plane index of the upper layer and the second layer was obtained from the X-ray diffraction pattern. From the obtained peak intensity of each plane index, I (111)/I (200) was obtained. The results are shown in Table 7 and Table 8.

TABLE 7

| Sample No. | Upper layer I (111)/I (200) |
| --- | --- |
| Invention sample 1 | 2.5 |
| Invention sample 2 | 2.5 |
| Invention sample 3 | 2.5 |
| Invention sample 4 | 2.5 |
| Invention sample 5 | 2.5 |
| Invention sample 6 | 2.5 |
| Invention sample 7 | 2.5 |
| Invention sample 8 | 2.5 |
| Invention sample 9 | 2.5 |
| Invention sample 10 | 2.5 |
| Invention sample 11 | 2.5 |
| Invention sample 12 | 2.5 |
| Invention sample 13 | 2.5 |
| Invention sample 14 | 2.5 |
| Invention sample 15 | 2.5 |
| Invention sample 16 | 1.2 |
| Invention sample 17 | 1.2 |
| Invention sample 18 | 8.2 |
| Invention sample 19 | 8.2 |
| Invention sample 20 | 3.0 |
| Invention sample 21 | 3.0 |
| Invention sample 22 | 3.0 |
| Invention sample 23 | 3.0 |
| Invention sample 24 | 3.0 |
| Invention sample 25 | 3.0 |
| Invention sample 26 | 3.0 |
| Invention sample 27 | 3.0 |
| Invention sample 28 | 3.0 |
| Invention sample 29 | 0.5 |
| Invention sample 30 | 0.5 |

TABLE 8

| Sample No. | Second layer I (111)/I (200) |
| --- | --- |
| Comparative sample 1 | 2.5 |
| Comparative sample 2 | 2.5 |
| Comparative sample 3 | 2.5 |
| Comparative sample 4 | 2.5 |
| Comparative sample 5 | 2.5 |
| Comparative sample 6 | 2.5 |
| Comparative sample 7 | 2.5 |
| Comparative sample 8 | 2.5 |
| Comparative sample 9 | 3.0 |
| Comparative sample 10 | 3.0 |
| Comparative sample 11 | 2.5 |
| Comparative sample 12 | 2.5 |
| Comparative sample 13 | 2.5 |
| Comparative sample 14 | 3.0 |
| Comparative sample 15 | 3.0 |
| Comparative sample 16 | 2.5 |
| Comparative sample 17 | 2.5 |
| Comparative sample 18 | 2.5 |

With regard to the obtained sample (coated cutting tool), residual stress in the upper layer and the second layer was measured by the sinew method using the X-ray diffractometer. As the residual stress, stresses at any three points in a section involved in cutting were measured, and the average value (arithmetic mean) thereof was defined as the residual stress in the upper layer or the second layer. The results are shown in Table 9 and Table 10.

TABLE 9

| Sample No. | Upper layer Residual stress value (GPa) |
| --- | --- |
| Invention sample 1 | −0.5 |
| Invention sample 2 | −0.5 |
| Invention sample 3 | −0.5 |
| Invention sample 4 | −0.5 |
| Invention sample 5 | −0.5 |
| Invention sample 6 | −0.5 |
| Invention sample 7 | −0.5 |
| Invention sample 8 | −0.5 |
| Invention sample 9 | −0.5 |
| Invention sample 10 | −0.5 |
| Invention sample 11 | −0.5 |
| Invention sample 12 | −0.5 |
| Invention sample 13 | −0.5 |
| Invention sample 14 | −0.5 |
| Invention sample 15 | −0.5 |
| Invention sample 16 | −0.5 |
| Invention sample 17 | −0.5 |
| Invention sample 18 | −0.1 |
| Invention sample 19 | −2.5 |
| Invention sample 20 | −0.1 |
| Invention sample 21 | −0.1 |
| Invention sample 22 | −1.0 |
| Invention sample 23 | −1.0 |
| Invention sample 24 | −1.0 |
| Invention sample 25 | −1.0 |
| Invention sample 26 | −0.1 |
| Invention sample 27 | −0.1 |
| Invention sample 28 | −0.1 |
| Invention sample 29 | −4.0 |
| Invention sample 30 | 0.2 |

TABLE 10

| Sample No. | Second layer Residual stress value (GPa) |
| --- | --- |
| Comparative sample 1 | −0.5 |
| Comparative sample 2 | −0.5 |
| Comparative sample 3 | −0.5 |
| Comparative sample 4 | −0.5 |
| Comparative sample 5 | −0.5 |
| Comparative sample 6 | −0.5 |
| Comparative sample 7 | −0.5 |
| Comparative sample 8 | −0.5 |
| Comparative sample 9 | −0.1 |
| Comparative sample 10 | −1.0 |
| Comparative sample 11 | −0.5 |
| Comparative sample 12 | −0.5 |
| Comparative sample 13 | −0.1 |
| Comparative sample 14 | −1.0 |
| Comparative sample 15 | −1.0 |
| Comparative sample 16 | −0.5 |
| Comparative sample 17 | −0.5 |
| Comparative sample 18 | −0.5 |

The average particle size of the particles forming the lower layer and the first layer of the obtained sample (coated cutting tool) was measured using a TEM. Specifically, a thin-film sample having an observation surface being a cross-sectional surface of the coating layer was produced using a focused ion beam (FIB) machining apparatus, and a photograph of a STEM image was taken. A straight line was drawn on the taken photograph in a direction parallel to the surface of the substrate, and the number of the particles forming the lower layer was measured. The length of the straight line was divided by the number of particles, and the obtained value was defined as an average particle size. Here, the length of the straight line was 10 μm. The average particle size of the particles forming each of the lower layer and first layer was determined. The results are shown in Table 11 and Table 12.

The average particle size of the particles forming the upper layer and the second layer of the obtained sample (coated cutting tool) was measured using an EBSD, which comes with an FE-SEM. Specifically, the coated cutting tool was polished with diamond paste, and was then finely polished with colloidal silica to obtain a cross-sectional structure surface of the coated cutting tool. A sample that was the cross-sectional structure surface of the coated cutting tool was set to the FE-SEM, and the sample was irradiated with an electron beam with an acceleration voltage of 15 kV and an irradiation current of 0.5 nA at an incident angle of 70°. A cross-sectional structure in the flank of the coated cutting tool was measured by the EBSD in a measurement range of 300 μm² with a step size of 0.1 μm. Here, a boundary having a misorientation of 5° or more was regarded as a grain boundary, and a region surrounded by the grain boundary was defined as a particle. The average particle size of the particles forming the upper layer and the second layer were obtained. The results are shown in Table 11 and Table 12.

TABLE 11

| Sample No. | Lower layer Average particle size (μm) | Upper layer Average particle size (μm) |
| --- | --- | --- |
| Invention sample 1 | 0.03 | 0.8 |
| Invention sample 2 | 0.03 | 0.8 |
| Invention sample 3 | 0.03 | 0.8 |
| Invention sample 4 | 0.03 | 0.8 |
| Invention sample 5 | 0.03 | 0.8 |
| Invention sample 6 | 0.03 | 0.8 |
| Invention sample 7 | 0.03 | 0.8 |
| Invention sample 8 | 0.03 | 0.8 |
| Invention sample 9 | 0.03 | 0.8 |
| Invention sample 10 | 0.03 | 0.8 |
| Invention sample 11 | 0.03 | 0.8 |
| Invention sample 12 | 0.03 | 0.8 |
| Invention sample 13 | 0.03 | 0.8 |
| Invention sample 14 | 0.01 | 0.8 |
| Invention sample 15 | 0.05 | 0.8 |
| Invention sample 16 | 0.03 | 0.2 |
| Invention sample 17 | 0.03 | 1.5 |
| Invention sample 18 | 0.03 | 1.5 |
| Invention sample 19 | 0.03 | 1.5 |
| Invention sample 20 | 0.03 | 0.8 |
| Invention sample 21 | 0.03 | 0.8 |
| Invention sample 22 | 0.03 | 0.8 |
| Invention sample 23 | 0.05 | 0.8 |
| Invention sample 24 | 0.01 | 0.8 |
| Invention sample 25 | 0.01 | 0.5 |
| Invention sample 26 | 0.01 | 0.5 |
| Invention sample 27 | 0.01 | 0.5 |
| Invention sample 28 | 0.01 | 1.2 |
| Invention sample 29 | 0.03 | 2.0 |
| Invention sample 30 | 0.03 | 2.0 |

TABLE 12

| Sample No. | First layer Average particle size (μm) | Second layer Average particle size (μm) |
| --- | --- | --- |
| Comparative sample 1 | 0.30 | 0.8 |
| Comparative sample 2 | 0.03 | 0.8 |
| Comparative sample 3 | 0.03 | 0.8 |
| Comparative sample 4 | 0.03 | 0.8 |
| Comparative sample 5 | 0.03 | 0.8 |
| Comparative sample 6 | 0.15 | 0.8 |
| Comparative sample 7 | 0.03 | 0.8 |
| Comparative sample 8 | 0.03 | 0.8 |
| Comparative sample 9 | 0.03 | 0.8 |
| Comparative sample 10 | 0.30 | 0.5 |
| Comparative sample 11 | — | 0.8 |
| Comparative sample 12 | 0.03 | 0.8 |
| Comparative sample 13 | 0.30 | 0.8 |
| Comparative sample 14 | 0.01 | 0.8 |
| Comparative sample 15 | 0.20 | 0.5 |
| Comparative sample 16 | 0.03 | 0.8 |
| Comparative sample 17 | 0.10 | 0.8 |
| Comparative sample 18 | 0.03 | 0.8 |

*For convenience sake, "—" of comparative sample 11 represents that the first layer is not formed.

A surface or any cross-sectional surface of the cubic boron nitride-containing sintered body of the obtained sample (coated cutting tool) was mirror-polished. A back-scattered electron image of the polished surface of the cubic boron nitride-containing sintered body was observed using the FE-SEM. Further, a photograph of the structure of the cubic boron nitride-containing sintered body, which had been magnified 10,000 times, was taken using the FE-SEM.

With the use of commercially available image analysis software, the diameter of a circle whose area is as large as the area of cubic boron nitride in the structure photograph was obtained as the particle size of cubic boron nitride.

With the use of commercially available image analysis software, the particle size of cubic boron nitride present in the structure of sintered body was measured in accordance with ASTM E 112-96.

Particle sizes of a plurality of cubic boron nitride (cBN) particles present in the structure photograph were measured. The average value of the measured particle sizes of cubic boron nitride was obtained as the average particle size of cubic boron nitride. The results are shown in Table 13 and Table 14.

TABLE 13

| Sample No. | Cubic boron nitride-containing sintered body Average particle size (μm) |
| --- | --- |
| Invention sample 1 | 2.0 |
| Invention sample 2 | 2.0 |
| Invention sample 3 | 2.0 |
| Invention sample 4 | 2.0 |
| Invention sample 5 | 2.0 |
| Invention sample 6 | 2.0 |
| Invention sample 7 | 2.0 |
| Invention sample 8 | 2.0 |
| Invention sample 9 | 2.0 |
| Invention sample 10 | 2.0 |
| Invention sample 11 | 2.0 |
| Invention sample 12 | 1.5 |
| Invention sample 13 | 4.0 |
| Invention sample 14 | 2.0 |
| Invention sample 15 | 2.0 |
| Invention sample 16 | 2.0 |
| Invention sample 17 | 2.0 |
| Invention sample 18 | 2.0 |

TABLE 13-continued

| Sample No. | Cubic boron nitride-containing sintered body Average particle size (μm) |
|---|---|
| Invention sample 19 | 2.0 |
| Invention sample 20 | 2.0 |
| Invention sample 21 | 2.0 |
| Invention sample 22 | 2.0 |
| Invention sample 23 | 3.0 |
| Invention sample 24 | 3.0 |
| Invention sample 25 | 3.0 |
| Invention sample 26 | 1.5 |
| Invention sample 27 | 1.5 |
| Invention sample 28 | 1.5 |
| Invention sample 29 | 2.0 |
| Invention sample 30 | 2.0 |

TABLE 14

| Sample No. | Cubic boron nitride-containing sintered body Average particle size (μm) |
|---|---|
| Comparative sample 1 | 2.0 |
| Comparative sample 2 | 2.0 |
| Comparative sample 3 | 2.0 |
| Comparative sample 4 | 0.5 |
| Comparative sample 5 | 6.0 |
| Comparative sample 6 | 2.0 |
| Comparative sample 7 | 2.0 |
| Comparative sample 8 | 2.0 |
| Comparative sample 9 | 2.0 |
| Comparative sample 10 | 3.0 |
| Comparative sample 11 | 2.0 |
| Comparative sample 12 | 2.0 |
| Comparative sample 13 | 6.0 |
| Comparative sample 14 | 3.0 |
| Comparative sample 15 | 3.0 |
| Comparative sample 16 | 2.0 |
| Comparative sample 17 | 2.0 |
| Comparative sample 18 | 2.0 |

The following cutting test was performed using the obtained sample (coated cutting tool). The results are shown in Table 15 and Table 16.

Cutting Test
Insert shape: CNGA120408
Workpiece: SCM415H
Workpiece shape: Cylinder of Ø 150 mm×300 mm
Cutting speed: 150 m/min
Feed: 0.15 mm/rev
Depth of cut: 0.15 mm
Coolant: Used
Evaluation items: A time at which the sample (coated cutting tool) was fractured (cracks were caused in the cutting edge portion of the sample) or a time at which the wear width of a corner cutting edge reached 0.15 mm was defined as the end of the tool life, and the machining length to reach the end of the tool life was measured.

TABLE 15

| Sample No. | Cutting test Damaged condition when machining is performed by 0.7 m | Machining length (m) | Damage form |
|---|---|---|---|
| Invention sample 1 | Normal wear | 5.3 | Normal wear |
| Invention sample 2 | Normal wear | 5.7 | Normal wear |
| Invention sample 3 | Normal wear | 5.5 | Normal wear |
| Invention sample 4 | Normal wear | 5.1 | Normal wear |
| Invention sample 5 | Normal wear | 5.2 | Normal wear |
| Invention sample 6 | Normal wear | 5.4 | Normal wear |
| Invention sample 7 | Normal wear | 5.8 | Normal wear |
| Invention sample 8 | Normal wear | 5.1 | Normal wear |
| Invention sample 9 | Normal wear | 5.2 | Normal wear |
| Invention sample 10 | Normal wear | 4.4 | Normal wear |
| Invention sample 11 | Normal wear | 6.4 | Normal wear |
| Invention sample 12 | Normal wear | 5.4 | Normal wear |
| Invention sample 13 | Normal wear | 5.6 | Normal wear |
| Invention sample 14 | Normal wear | 5.1 | Normal wear |
| Invention sample 15 | Normal wear | 4.8 | Normal wear |
| Invention sample 16 | Normal wear | 4.8 | Normal wear |
| Invention sample 17 | Normal wear | 4.9 | Normal wear |
| Invention sample 18 | Normal wear | 5.2 | Normal wear |
| Invention sample 19 | Normal wear | 5.3 | Normal wear |
| Invention sample 20 | Normal wear | 5.1 | Normal wear |
| Invention sample 21 | Normal wear | 5.3 | Normal wear |
| Invention sample 22 | Normal wear | 4.7 | Normal wear |
| Invention sample 23 | Normal wear | 5.0 | Normal wear |
| Invention sample 24 | Normal wear | 5.1 | Normal wear |
| Invention sample 25 | Normal wear | 5.3 | Normal wear |
| Invention sample 26 | Normal wear | 5.0 | Normal wear |
| Invention sample 27 | Normal wear | 4.9 | Normal wear |
| Invention sample 28 | Normal wear | 5.2 | Normal wear |
| Invention sample 29 | Normal wear | 4.1 | Chipping |
| Invention sample 30 | Normal wear | 4.3 | Chipping |

TABLE 16

| Sample No. | Cutting test Damaged condition when machining is performed by 0.7 m | Machining length (m) | Damage form |
|---|---|---|---|
| Comparative sample 1 | Chipping | 1.9 | Fracturing |
| Comparative sample 2 | Normal wear | 3.4 | Fracturing |
| Comparative sample 3 | Chipping | 2.2 | Fracturing |
| Comparative sample 4 | Normal wear | 3.6 | Fracturing |
| Comparative sample 5 | Normal wear | 2.5 | Fracturing |
| Comparative sample 6 | Chipping | 2.4 | Fracturing |
| Comparative sample 7 | Normal wear | 1.4 | Fracturing |
| Comparative sample 8 | Normal wear | 1.5 | Fracturing |
| Comparative sample 9 | Normal wear | 3.4 | Fracturing |
| Comparative sample 10 | Chipping | 1.8 | Fracturing |
| Comparative sample 11 | Chipping | 1.2 | Fracturing |
| Comparative sample 12 | Normal wear | 3.5 | Fracturing |
| Comparative sample 13 | Normal wear | 2.3 | Fracturing |
| Comparative sample 14 | Chipping | 1.8 | Fracturing |
| Comparative sample 15 | Chipping | 1.2 | Fracturing |
| Comparative sample 16 | Chipping | 1.4 | Fracturing |
| Comparative sample 17 | Normal wear | 3.6 | Fracturing |
| Comparative sample 18 | Normal wear | 3.6 | Chipping |

In the cutting test, the machining lengths of invention samples were 4.1 m or more and were longer than all machining lengths of comparative samples. Further, with regard to the damage form of invention samples, chipping occurred in some samples but no complete fracturing was observed by the time when the wear width at the corner cutting edge reached 0.15 mm. On the other hand, the damage forms of all comparative samples were fracturing.

When the damaged condition was observed when the machining length was 0.7 m, the damaged conditions of all invention samples were the normal wear. On the other hand, chipping occurred in comparative samples 1, 3, 6, 10, 11, 14, and 15. It was considered that this was due to low adhesion between the coating layer and the substrate, or low adhesion between the lower layer and the upper layer. Further, the damaged conditions of comparative samples 4, 9, and 12 were the normal wear, but it was considered that the wear resistance was low because the wear width was large. The damaged conditions of comparative samples 2, 5, 7, 8, and 13 were the normal wear, but fracturing occurred with a short machining length with which no fracturing occurred in invention samples. It was considered that this was due to low strength of the substrate or the coating layer.

From the results described above, it is found that invention samples have a longer tool life by virtue of the improvement in wear resistance and fracture resistance.

INDUSTRIAL APPLICABILITY

The tool life of the coated cutting tool of the present invention can be extended compared to the conventional coated cutting tools, and hence the coated cutting tool has high industrial applicability.

REFERENCE SIGNS LIST

1: Substrate, 2: Lower layer, 3: Upper layer, 4: Coating layer, 5: Coated cutting tool.

What is claimed is:

1. A coated cutting tool, comprising:
a substrate made of a cubic boron nitride-containing sintered body; and
a coating layer formed on the substrate, wherein
the cubic boron nitride-containing sintered body includes 65 volume % or more and 85 volume % or less of cubic boron nitride, and 15 volume % or more and 35 volume % or less of a binder phase;
the cubic boron nitride is in a form of particles, the particles having an average particle size from 1.5 μm or more to 4.0 μm or less;
the coating layer includes a lower layer, and an upper layer formed on the lower layer;
the lower layer contains particles each having a composition represented by formula (1) below:

$$(Ti_{1-x}Al_x)N \qquad (1)$$

in formula (1), x denotes an atomic ratio of an Al element to a total of a Ti element and the Al element and satisfies 0.55≤x≤0.80;
the lower layer has an average thickness from 0.1 μm or more to 1.0 μm or less;
the particles forming the lower layer have an average particle size from 0.01 μm or more to 0.05 μm or less;
the upper layer contains particles each having a composition represented by formula (2) below:

$$(Ti_{1-y}Al_y)(C_{1-z}N_z) \qquad (2)$$

in formula (2), y denotes the atomic ratio of the Al element to a total of the Ti element and the Al element and satisfies 0≤y≤0.80, and z denotes an atomic ratio of an N element to a total of a C element and the N element and satisfies 0.65≤z<1.00; and
the upper layer has an average thickness from 1.0 μm or more to 5.0 μm or less.

2. The coated cutting tool according to claim 1, wherein the particles forming the upper layer have an average particle size from 0.1 μm or more to 1.5 μm or less.

3. The coated cutting tool according to claim 1, wherein the upper layer contains particles each having a composition represented by formula (3) below:

$$Ti(C_{1-z}N_z) \qquad (3)$$

in formula (3), z denotes the atomic ratio of the N element to a total of the C element and the N element and satisfies 0.65≤z≤0.90.

4. The coated cutting tool according to claim 1, wherein a compound forming the upper layer is a cubic crystal; and
in X-ray diffraction analysis, a ratio I (111)/I (200) between a peak intensity I (111) of a plane (111) of the upper layer, and a peak intensity I (200) of a plane (200) of the upper layer is more than 1 and 15 or less.

5. The coated cutting tool according to claim 1, wherein the coating layer has an average thickness from 1.5 μm or more to 6.0 μm or less.

6. The coated cutting tool according to claim 1, wherein the upper layer has a residual stress value from −3.0 GPa or higher to −0.1 GPa or lower.

7. The coated cutting tool according to claim 1, wherein the binder phase includes a compound formed of at least one metal element selected from the group consisting of Ti, Zr, Hf, V, Nb, Ta, Cr, Mo, W, Al, and Co, and at least one element selected from the group consisting of C, N, O, and B.

8. The coated cutting tool according to claim 2, wherein the upper layer contains particles each having a composition represented by formula (3) below:

$$Ti(C_{1-z}N_z) \qquad (3)$$

in formula (3), z denotes the atomic ratio of the N element to a total of the C element and the N element and satisfies 0.65≤z≤0.90.

9. The coated cutting tool according to claim 2, wherein a compound forming the upper layer is a cubic crystal; and
in X-ray diffraction analysis, a ratio I (111)/I (200) between a peak intensity I (111) of a plane (111) of the upper layer, and a peak intensity I (200) of a plane (200) of the upper layer is more than 1 and 15 or less.

10. The coated cutting tool according to claim 3, wherein a compound forming the upper layer is a cubic crystal; and
in X-ray diffraction analysis, a ratio I (111)/I (200) between a peak intensity I (111) of a plane (111) of the upper layer, and a peak intensity I (200) of a plane (200) of the upper layer is more than 1 and 15 or less.

11. The coated cutting tool according to claim 8, wherein a compound forming the upper layer is a cubic crystal; and
in X-ray diffraction analysis, a ratio I (111)/I (200) between a peak intensity I (111) of a plane (111) of the upper layer, and a peak intensity I (200) of a plane (200) of the upper layer is more than 1 and 15 or less.

12. The coated cutting tool according to claim 2, wherein the coating layer has an average thickness from 1.5 μm or more to 6.0 μm or less.

13. The coated cutting tool according to claim 3, wherein the coating layer has an average thickness from 1.5 μm or more to 6.0 μm or less.

14. The coated cutting tool according to claim 4, wherein the coating layer has an average thickness from 1.5 μm or more to 6.0 μm or less.

15. The coated cutting tool according to claim 8, wherein the coating layer has an average thickness from 1.5 μm or more to 6.0 μm or less.

16. The coated cutting tool according to claim 9, wherein the coating layer has an average thickness from 1.5 μm or more to 6.0 μm or less.

17. The coated cutting tool according to claim 10, wherein the coating layer has an average thickness from 1.5 μm or more to 6.0 μm or less.

18. The coated cutting tool according to claim 11, wherein the coating layer has an average thickness from 1.5 μm or more to 6.0 μm or less.

19. The coated cutting tool according to claim 2, wherein the upper layer has a residual stress value from −3.0 GPa or higher to −0.1 GPa or lower.

20. The coated cutting tool according to claim 3, wherein the upper layer has a residual stress value from −3.0 GPa or higher to −0.1 GPa or lower.

* * * * *